(12) United States Patent
Schwille

(10) Patent No.: US 10,641,722 B2
(45) Date of Patent: May 5, 2020

(54) MICROMECHANICAL MOISTURE SENSOR DEVICE AND CORRESPONDING MANUFACTURING METHOD

(71) Applicant: Robert Bosch GmbH, Stuttgart (DE)

(72) Inventor: Matthias Christian Schwille, Tuebingen (DE)

(73) Assignee: Robert Bosch GmbH, Stuttgart (DE)

( * ) Notice: Subject to any disclaimer, the term of this patent is extended or adjusted under 35 U.S.C. 154(b) by 201 days.

(21) Appl. No.: 15/483,319

(22) Filed: Apr. 10, 2017

(65) Prior Publication Data

US 2017/0315074 A1 Nov. 2, 2017

(30) Foreign Application Priority Data

Apr. 28, 2016 (DE) .................. 10 2016 207 260

(51) Int. Cl.
| | |
|---|---|
| *G01N 27/12* | (2006.01) |
| *H01L 49/00* | (2006.01) |
| *B81B 7/02* | (2006.01) |
| *G01N 27/22* | (2006.01) |

(52) U.S. Cl.
CPC ............. *G01N 27/121* (2013.01); *B81B 7/02* (2013.01); *G01N 27/225* (2013.01); *H01L 49/00* (2013.01)

(58) Field of Classification Search
CPC .. G01N 27/121; G01N 27/223; G01N 27/225; B81B 7/02
See application file for complete search history.

(56) References Cited

U.S. PATENT DOCUMENTS

| | | | | |
|---|---|---|---|---|
| 2,726,305 A | * | 12/1955 | Craig ................... | G01N 27/121 252/502 |
| 4,227,190 A | * | 10/1980 | Kelley .................. | G01F 23/241 340/604 |
| 4,642,601 A | * | 2/1987 | Sugawara ............ | G01N 27/121 338/34 |
| 2003/0179805 A1 | * | 9/2003 | Hamamoto .......... | G01N 27/225 374/16 |

(Continued)

FOREIGN PATENT DOCUMENTS

| | | |
|---|---|---|
| DE | 4035371 A1 | 5/1992 |
| DE | 102014213390 A1 | 1/2016 |

(Continued)

*Primary Examiner* — Jeff W Natalini
(74) *Attorney, Agent, or Firm* — Norton Rose Fulbright US LLP; Gerard Messina

(57) ABSTRACT

A micromechanical moisture-sensor device and a corresponding manufacturing method. The micromechanical moisture-sensor device is equipped with a first electrode device situated on the substrate; a second electrode device situated on the substrate; an electrical insulation device situated between the first electrode device and the second electrode device which includes a first area, which is in contact with the first electrode device and the second electrode device, and which includes a second area, which is exposed by the first electrode device and the second electrode device; a moisture-sensitive functional layer, which is applied across the first electrode device and the second electrode device and the second area of the insulation device lying between them in such a way that it forms a moisture-sensitive resistive electrical shunt at least in some areas between the first electrode device and the second electrode device.

13 Claims, 2 Drawing Sheets

(56) References Cited

U.S. PATENT DOCUMENTS

| | | | |
|---|---|---|---|
| 2004/0237646 A1* | 12/2004 | Fujita | G01N 27/121 |
| | | | 73/335.05 |
| 2009/0211108 A1* | 8/2009 | Moschutz | D06F 58/04 |
| | | | 34/491 |
| 2010/0307238 A1* | 12/2010 | Van Popta | G01N 27/225 |
| | | | 73/335.04 |
| 2011/0311725 A1* | 12/2011 | Sneh | C01B 21/16 |
| | | | 427/250 |
| 2014/0169405 A1 | 6/2014 | Graham et al. | |
| 2017/0248537 A1* | 8/2017 | Serban | G01N 27/225 |

FOREIGN PATENT DOCUMENTS

| | | |
|---|---|---|
| WO | 2014099915 A1 | 6/2014 |
| WO | 2014150093 A1 | 9/2014 |

\* cited by examiner

MICROMECHANICAL MOISTURE SENSOR DEVICE AND CORRESPONDING MANUFACTURING METHOD

CROSS REFERENCE

The present application claims the benefit under 35 U.S.C. § 119 of German Patent Application No. DE 102016207260.9 filed on Apr. 28, 2016, which is expressly incorporated herein by reference in its entirety.

FIELD

The present invention relates to a micromechanical moisture sensor device and a corresponding manufacturing method including a heating device.

BACKGROUND INFORMATION

Moisture sensors for the determination of moisture of gases, in particular including capacitive evaluation of polymeric functional layers, are available in the related art. German Patent No. DE 40 35 371 A1 describes a capacitive moisture sensor including a capacitor having two metallic electrodes and a substrate supporting the capacitor. Between the two electrodes, one of which is formed by a moisture-permeable metallic layer, is located a moisture-sensitive polymer film as a dielectric, which is made of polyetherimide.

Such polymeric functional layers are sensitive to environmental influences, and furthermore, the capacitive evaluation structure requires extensive structuring and deposition steps.

SUMMARY

The present invention provides a micromechanical moisture sensor device and a corresponding manufacturing method.

Preferred refinements are described herein.

In accordance with the present invention, a moisture-sensitive functional layer is applied across a capacitor-like structure in a film-like manner in such a way that it forms a moisture-sensitive resistive electrical shunt at least in some areas between the two electrode devices of the capacitor structure.

The micromechanical moisture sensor device according to the present invention is based on standard micromechanical processes and it may be manufactured with comparatively little complexity.

According to a preferred refinement, the first electrode device and the second electrode device and the insulation device are vertically stacked on the substrate. This makes it possible to achieve a compact design.

According to another preferred refinement, the first electrode device and the second electrode device are situated laterally spaced on the insulation device. This makes it possible to implement a large sensor range.

According to another preferred refinement, the second electrode device includes an electrode plate and the first electrode device includes a plurality of electrode bars which are situated laterally spaced having an insulation area of the insulation device located between each of them on the electrode plate in such a way that a parallel circuit is formed by a corresponding plurality of moisture-sensitive resistive electrical shunts between the first electrode device and the second electrode device. This design is easy to manufacture and makes a high measuring sensitivity possible.

According to another preferred refinement, a heating device for heating the moisture-sensitive functional layer is situated on or in the substrate. This makes it possible to shorten the response time in the case of moisture changes. Moreover, the temperature compensation of the conductivity in the ASIC may be eliminated.

According to another preferred refinement, the first electrode device and the second electrode device are connected to a current measuring device via an electrical contact device. The corresponding contacting structure of the contact device for the moisture-sensitive functional layer may be advantageously produced cost-effectively using conventional semiconductor processes.

According to another preferred refinement, the moisture-sensitive functional layer is an oxide layer, in particular an oxide layer deposited using atomic layer deposition (ALD), which preferably has a thickness in the range 1 nm through 100 nm. An ALD deposition using BDEAS (bis(diethylamino)silane) and ozone in a suitable deposition layer makes it possible to produce a moisture-sensitive functional layer in the form of an oxide layer. In a moist environment, the conductivity of the moisture-sensitive functional layer rises sharply, making it possible to achieve a high measuring sensitivity.

According to another preferred refinement, the insulation device is manufactured from thermal silicon oxide. This makes it possible to ensure that the conductivity of the insulation device is significantly lower than that of the moisture-sensitive functional layer.

According to another preferred refinement, the first electrode device and the second electrode device are manufactured from polysilicon. This makes it possible to use a standard deposition process.

BRIEF DESCRIPTION OF THE DRAWINGS

Additional features and advantages of the present invention are explained below based on specific embodiments with reference to the figures.

DETAILED DESCRIPTION OF EXAMPLE EMBODIMENTS

Identical reference symbols in the figures denote identical elements or elements having an identical function.

Figure 1:
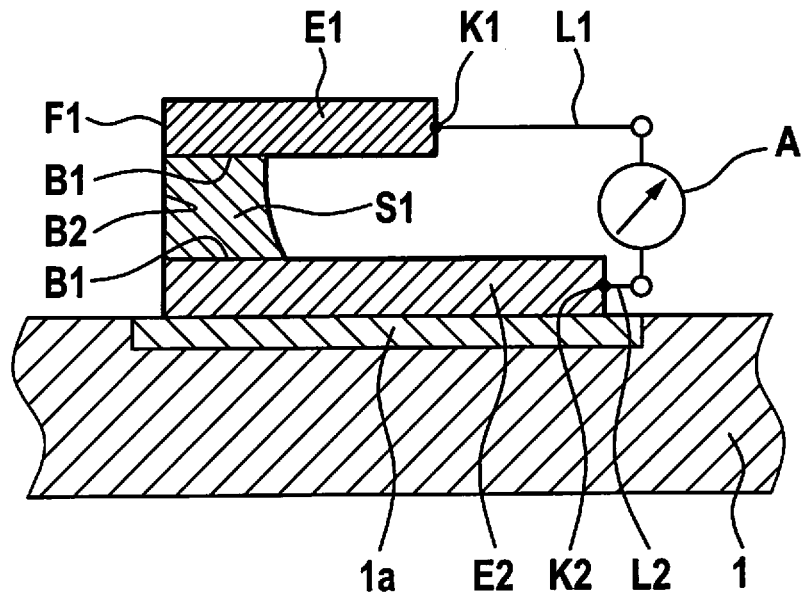
FIG. 1 shows a schematic cross-sectional representation for elucidating a micromechanical moisture sensor device according to a first specific embodiment of the present invention.

FIG. 1 shows a schematic cross-sectional representation for elucidating a micromechanical moisture sensor device according to a first specific embodiment of the present invention.

In FIG. 1, reference numeral 1 denotes a substrate, for example, a silicon wafer substrate. An electrical insulation area 1a is provided on or in substrate 1. A capacitor-like structure is provided on insulation area 1a, which includes a first electrode device E1, a second electrode device E2 and an insulation device S1 lying between them. Insulation device S1 should have preferably little leakage current and a high electrical breakdown strength. Suitable materials include, for example, polysilicon for first electrode device E1 and second electrode device E2 as well as thermally deposited silicon dioxide for insulation device S1. In the present example, first electrode device E1 and second electrode device E2 and insulation device S1 are vertically stacked on substrate 1.

The system is designed in such a way that electrical insulation device S1 includes a first area B1, which is in contact with first electrode device E1 and second electrode device E2, and includes a second area B2, which is exposed by first electrode device E1 and second electrode device E2, specifically laterally in the present example.

A moisture-sensitive functional layer F1 is applied across first electrode device E1 and second electrode device E2 and area B2 of insulation device S1 lying between them in such a way that it forms a moisture-sensitive resistive electrical shunt between first electrode device E1 and second electrode device E2. In the present example, entire second area B2 is covered by moisture-sensitive functional layer F1. Moisture-sensitive functional layer F1 typically has a thickness of 1 nm through 100 nm and is advantageously produced with the aid of an ALD method, which may be used after the structuring of the capacitor-like structure. In the present example, the ALD deposition is carried out from bis(diethylamino)silane (BDEAS) and ozone, which results in a moisture-sensitive functional layer F1 of ALD silicon oxide.

Preferably, before moisture-sensitive functional layer F1 is deposited, contacts K1, K2 are formed on first electrode device E1 and second electrode device E2, which is carried out by metallization in some areas, for example, using a gold layer. If necessary, the metallization may also be carried out after moisture-sensitive functional layer F1 is deposited.

The ALD deposition method makes is possible to produce a thin, highly uniform moisture-sensitive functional layer F1. Since, apart from its moisture-sensitive property, the moisture-sensitive functional layer also has, in principle, insulating electrical properties, short circuits between the electrodes caused, for example, by particles applied later, are effectively avoided, if contacts K1, K2 are applied before functional layer F1. In conventional bonding methods, moisture-sensitive functional layer F1 may then be penetrated without difficulty on the metallized contact areas.

Via schematically placed line devices L1, L2, which are formed, for example, with the aid of the mentioned bond connection, a current measuring device A may be connected, which, with the aid of current measurement, makes it possible to ascertain the moisture content of moisture-sensitive functional layer F1.

Figure 2:
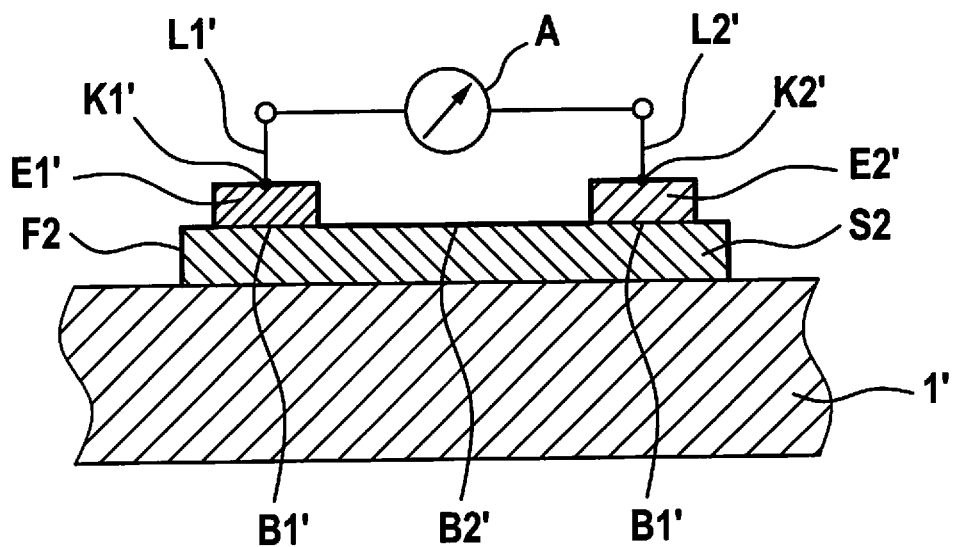
FIG. 2 shows a schematic cross-sectional representation for elucidating a micromechanical moisture sensor device according to a second specific embodiment of the present invention.

FIG. 2 shows a schematic cross-sectional representation for elucidating a micromechanical moisture sensor device according to a second specific embodiment of the present invention.

In the second specific embodiment, the substrate bears the reference numeral 1' and is, for example, again a silicon wafer substrate. In this specific embodiment, insulation device S2 is structured in a plate-like manner on substrate 1', and on the insulation device, first electrode device E1' and the second electrode device E2' are situated laterally spaced from one another.

In this embodiment also, moisture-sensitive functional layer F2 is deposited across the entire capacitor structure, so that total second area B2' of insulation device S2 may be used for determining moisture. In this specific embodiment, second area B2' may thus be designed substantially larger than first area B1' which is in contact with first and second electrode device E1', E2'. Contact devices K1', K2' and line devices L1', L2' for connecting current measuring device A are formed in a manner similar to that described above for the first specific embodiment.

Figure 3:
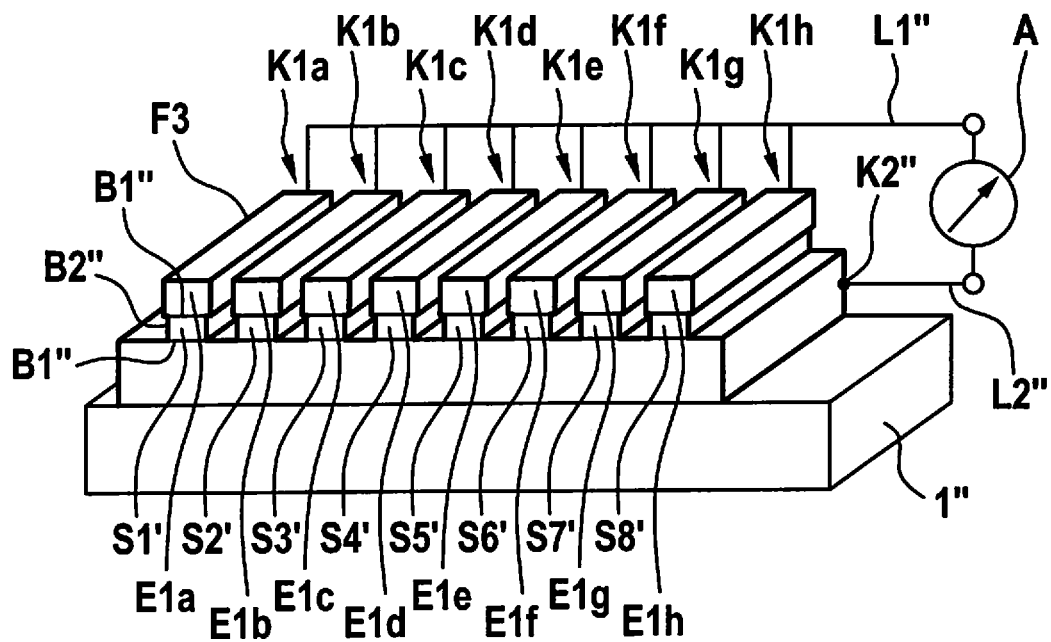
FIG. 3 shows a schematic perspective representation for elucidating a micromechanical moisture sensor device according to a third specific embodiment of the present invention.

FIG. 3 shows a schematic perspective representation for elucidating a micromechanical moisture sensor device according to a third specific embodiment of the present invention.

In the third specific embodiment, reference numeral 1" denotes the substrate, which is, for example, again a silicon wafer substrate. Second electrode device E2" thus includes a single continuous electrode plate, while the first electrode device includes a plurality of electrode bars E1a through E1h which are situated laterally spaced having an insulation area S1' through S8' of the insulation device located between each of them on the electrode plate in such a way that a parallel circuit is formed by a plurality of moisture-sensitive resistive electrical shunts between first electrode device E1a through E1h and second electrode device E2" through moisture-sensitive functional layer F3.

The areas of insulation areas S1' through S8' which are exposed by first electrode device E1a through E1h and second electrode device E2" are denoted by reference numeral B2", while the areas which are in contact with the first electrode device and the second electrode device are denoted by reference numeral B1".

Contacts K1a through K1h of the first electrode device including the plurality of electrode bars E1a through E1h are not visible in the present representation, since they lie at the end of the structure which faces away. Contacts K1a through K1h are parallel-connected with the aid of a first line device L1", while contact K2" of second electrode device E2' has a single line device L2" which is used for electrically connecting current measuring device A.

Figure 4:
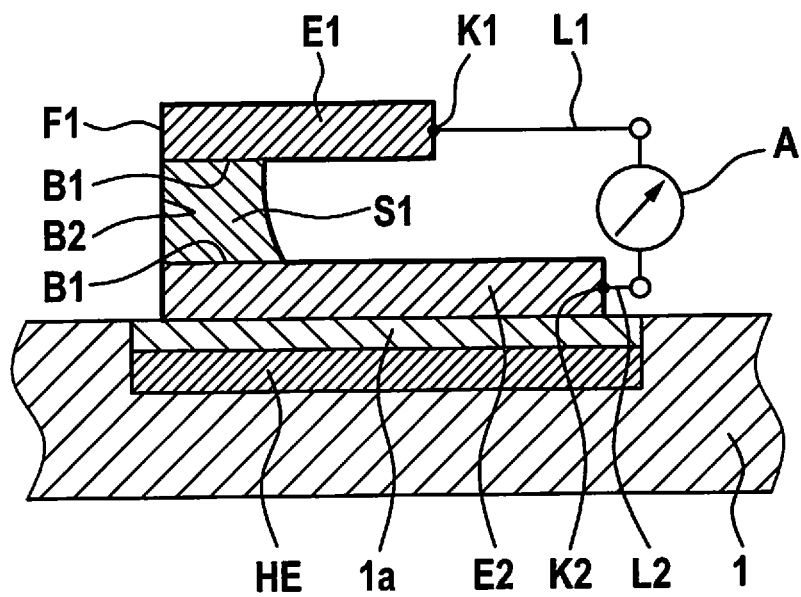
FIG. 4 shows a schematic cross-sectional representation for elucidating a micromechanical moisture sensor device according to a fourth specific embodiment of the present invention.

FIG. 4 shows a schematic cross-sectional representation for elucidating a micromechanical moisture sensor device according to a fourth specific embodiment of the present invention.

In its design, the fourth specific embodiment is essentially similar to the already described first specific embodiment, a heating device HE for heating moisture-sensitive functional layer F1 being additionally situated in substrate 1. In the present example, heating device HE is separated from the active sensor structure by insulation area 1a. Heating device HE makes it possible to eliminate the otherwise necessary temperature compensation of the conductivity in the ASIC and to optimize the response time in the case of moisture changes.

Although the present invention has been described with reference to preferred exemplary embodiments, it is not limited thereto.

In particular, the above-named named materials and topologies are only exemplary and not limited to the explained examples.

In particular, the geometries and materials described herein are only exemplary and may be varied in various ways depending on the application.

What is claimed is:

1. A micromechanical moisture sensor device, comprising:
   a substrate;

a first electrode device situated on the substrate;
a second electrode device situated on the substrate;
an electrical insulation device situated between the first electrode device and the second electrode device, the insulation device including:
a first area which is in contact with the first electrode device,
a second area which is uncovered by the first electrode device and the second electrode device, and
a third area that is in contact with the second electrode device;
a moisture-sensitive functional layer which is applied directly onto the first electrode device, the second electrode device, and the second area of the insulation device lying between them in such a way that the moisture-sensitive functional layer forms a moisture-sensitive resistive electrical shunt at least in some areas between the first electrode device and the second electrode device, wherein the moisture-sensitive functional layer has a uniform thickness on the first electrode device, the second electrode device, and the second area of the insulation device, wherein:
the first electrode device and the second electrode device and the insulation device are vertically stacked on the substrate,
the second electrode device includes an electrode plate and the first electrode device includes a plurality of electrode bars which are situated laterally spaced having an insulation area of the insulation device located between each of them on the electrode plate in such a way that a parallel circuit is formed by a corresponding plurality of moisture-sensitive resistive electrical shunts between the first electrode device and the second electrode device,
the electrode plate includes a top surface having a single continuous planar shape,
the insulation device includes a plurality of insulation bars laterally spaced apart from each other and vertically stacked on top of and in direct contact with the electrode plate on the top surface of the electrode plate, and
each of the electrode bars is stacked on top of and in direct contact with a respective one of the insulation bars.

2. The micromechanical moisture sensor device as recited in claim 1, wherein the first electrode device and the second electrode device are situated laterally spaced on the insulation device.

3. The micromechanical moisture sensor device as recited in claim 1, wherein a heating device for heating the moisture-sensitive functional layer is situated on or in the substrate.

4. The micromechanical moisture sensor device as recited in claim 1, wherein the first electrode device and the second electrode device are connected to a current measuring device via an electrical contact device.

5. The micromechanical moisture sensor device as recited in claim 1, wherein the moisture-sensitive functional layer is a moisture-sensitive oxide that has a thickness in the range 1 nm through 100 nm.

6. The micromechanical moisture sensor device as recited in claim 1, wherein the insulation device is manufactured from thermal silicon oxide.

7. The micromechanical moisture sensor device as recited in claim 1, wherein the first electrode device and the second electrode device are manufactured from polysilicon.

8. The micromechanical moisture sensor as recited in claim 1, wherein the first electrode device, the second electrode device, and the electrical insulation device are stacked on top of one another in such a way that a vertical axis intersects the first electrode, the second electrode, and the electrical insulation device.

9. A method for manufacturing a micromechanical moisture sensor device, comprising:
providing a substrate;
forming a first electrode device on the substrate;
forming a second electrode device on the substrate;
forming an electrical insulation device between the first electrode device and the second electrode device, the insulation device including:
a first area which is in contact with the first electrode device,
a second area which is uncovered by the first electrode device and the second electrode device, and
a third area that is in contact with the second electrode device;
depositing a moisture-sensitive functional layer directly onto the first electrode device, the second electrode device, and the second area of the insulation device lying between them in such a way that the moisture-sensitive functional layer forms a moisture-sensitive resistive electrical shunt at least in some areas between the first electrode device and the second electrode device, wherein the moisture-sensitive functional layer has a uniform thickness on the first electrode device, the second electrode device, and the second area of the insulation device, wherein:
the second electrode device is formed as an electrode plate and the first electrode device is formed as a plurality of electrode bars which are situated laterally spaced having an insulation area of the insulation device located between each of them on the electrode plate in such a way that a parallel circuit is formed by a corresponding plurality of moisture-sensitive resistive electrical shunts between the first electrode device and the second electrode device,
the electrode plate is formed as having a top surface having a single continuous planar shape,
the insulation device is formed as a plurality of insulation bars laterally spaced apart from each other and vertically stacked on top of and in direct contact with the electrode plate on the top surface of the electrode plate, and
each of the electrode bars is stacked on top of and in direct contact with a respective one of the insulation bars.

10. The method as recited in claim 9, wherein the deposition is carried out with the aid of an ALD method in a temperature range between 50° C. and 500° C.

11. The method as recited in claim 10, wherein the deposition is carried out with the aid of BDEAS and ozone.

12. The method as recited in claim 9, wherein the moisture-sensitive functional layer is an atomic layer deposition (ALD) oxide layer deposited using bis(diethylamino)silane (BDEAS) and ozone, which has a thickness in the range 1 nm through 100 nm.

13. The method as recited in claim 9, wherein the first electrode device, the second electrode device, and the electrical insulation device are stacked on top of one another in such a way that a vertical axis intersects the first electrode, the second electrode, and the electrical insulation device.

* * * * *